(12) United States Patent
Kim

(10) Patent No.: US 8,900,741 B2
(45) Date of Patent: Dec. 2, 2014

(54) PROTECTIVE CIRCUIT BOARD AND BATTERY PACK USING THE SAME

(75) Inventor: Bong-Young Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 1170 days.

(21) Appl. No.: 12/379,079

(22) Filed: Feb. 12, 2009

(65) Prior Publication Data

US 2009/0246611 A1    Oct. 1, 2009

(30) Foreign Application Priority Data

Mar. 28, 2008  (KR) .................. 10-2008-0029039

(51) Int. Cl.

| | | |
|---|---|---|
| H01M 2/26 | (2006.01) | |
| H01M 2/34 | (2006.01) | |
| H01M 2/04 | (2006.01) | |
| H01M 10/42 | (2006.01) | |
| H05K 1/11 | (2006.01) | |
| H05K 3/32 | (2006.01) | |
| H01M 2/12 | (2006.01) | |
| H01M 2/36 | (2006.01) | |

(52) U.S. Cl.
CPC .............. *H01M 2/34* (2013.01); *H01M 2/0404* (2013.01); *H01M 10/4257* (2013.01); *H05K 1/117* (2013.01); *H05K 3/328* (2013.01); *H01M 2/1241* (2013.01); *H01M 2/36* (2013.01); *H01M 2200/00* (2013.01); *H05K 2201/09045* (2013.01); *H05K 2201/09063* (2013.01); *H05K 2201/09845* (2013.01); *H05K 2201/10037* (2013.01)
USPC .............................. 429/161; 429/121; 429/178

(58) Field of Classification Search
USPC .......................................... 429/161, 121, 178
See application file for complete search history.

(56) References Cited

U.S. PATENT DOCUMENTS

| 6,524,732 | B1 * | 2/2003 | Iwaizono et al. ................. 429/7 |
| 7,528,573 | B2 | 5/2009 | Hong et al. |
| 2007/0298287 | A1 | 12/2007 | Tajima et al. |

FOREIGN PATENT DOCUMENTS

| CN | 2783537 Y | 5/2006 |
| CN | 1838464 A | 9/2006 |
| JP | 07-130342 A | 5/1995 |
| JP | 2000-149889 A | 5/2000 |
| JP | 2002-298809 A | 10/2002 |
| JP | 2005-276525 A | 10/2005 |
| JP | 2006-187185 A | 7/2006 |
| JP | 2006-269411 A | 10/2006 |
| JP | 2007-311368 A | 11/2007 |
| JP | 2008-010501 A | 1/2008 |
| JP | 2009-146600 A | 7/2009 |
| KR | 10-2007-0098458 A | 10/2007 |
| KR | 10-0791551 B1 | 12/2007 |
| WO | WO 2009/025433 A1 | 2/2009 |

OTHER PUBLICATIONS

Chinese Office Action in CN 200910127097.1, dated Dec. 31, 2010 (Kim).
Chinese Certificate of Invention Patent in CN 200910127097.1, dated Nov. 9, 2011 (with English translation of Certificate only) (Kim).
Japanese Office Action in JP 2008-249961, dated Jan. 24, 2012 (Kim).

\* cited by examiner

*Primary Examiner* — Zachary Best
(74) *Attorney, Agent, or Firm* — Lee & Morse, P.C.

(57) ABSTRACT

A protective circuit board includes a printed circuit board, the printed circuit board including a first region and a second region, at least one safety device on the first region of the printed circuit board, the first region being thinner than the second region along a direction perpendicular to a contact plane between the printed circuit board and the safety device, and an external connection terminal on the printed circuit board.

19 Claims, 6 Drawing Sheets

PROTECTIVE CIRCUIT BOARD AND BATTERY PACK USING THE SAME

BACKGROUND OF THE INVENTION

1. Field of the Invention

Example embodiments relate to a protective circuit board and to a battery pack using the same. More particularly, example embodiments relate to a protective circuit board and a bare cell configured to have a reduced distance therebetween, and to a battery pack using the same.

2. Description of the Related Art

A secondary battery may be recharged and discharged to provide repeated use thereof, so the secondary battery may be economical as compared to a disposable battery. The secondary battery may be used in portable electronic products, e.g., a mobile phone, a notebook computer, a camcorder, a digital computer, and so forth, in high-powered products, e.g., a hybrid automobile, an electric tool, and so forth, etc. Examples of a secondary battery may include a nickel cadmium battery, a nickel metal hydride battery, a nickel zinc battery, a lithium ion secondary battery, a lithium polymer secondary battery, and the like.

A conventional secondary battery, e.g., a lithium secondary battery, may include an electrode assembly with an electrolyte in a cell case and a sealing cap for the cell case. The conventional cell case, i.e., a bare cell, may be electrically connected to a protective circuit board, which may prevent overcharge or overdischarge of the secondary battery.

The conventional protective circuit board may include electronic components to form an electric path between the bare cell and an external source when charging/discharging. The conventional protective circuit board may be spaced apart a predetermined distance from the bare cell to minimize electric interference between the electronic components of the protective circuit board and the bare cell of the secondary battery. The required predetermined distance between the conventional protective circuit board and the bare cell, however, may be relatively large, thereby decreasing capacity of the secondary battery.

SUMMARY OF THE INVENTION

Example embodiments are therefore directed to a protective circuit board and a battery pack using the same, which substantially overcome one or more of the disadvantages of the related art.

It is therefore a feature of an example embodiment to provide a protective circuit board structure configured to reduce distance therefrom to a bare cell.

It is another feature of an example embodiment to provide a battery pack including a protective circuit board with a structure configured to reduce distance therefrom to a bare cell.

At least one of the above and other features and advantages may be realized by providing a protective circuit board, including a printed circuit board, the printed circuit board having a first region and a second region, at least one safety device on the first region of the printed circuit board, the first region being thinner than the second region along a direction perpendicular to a contact plane between the printed circuit board and the safety device, and an external connection terminal on the printed circuit board.

The external connection terminal may be on the second region of the printed circuit board. The first region may include a smaller number of layers as compared to the second region. The safety device and the external connection terminal may be on different surfaces of the printed circuit board. The safety device and the external connection terminal may be on a same surface of the printed circuit board. The printed circuit board may include a first surface and a second surface opposite the first surface, the first surface being substantially planar, and the second surface defining the first region thinner than the second region with respect to a distance between the first and second surfaces. The safety device may be on the second surface of the printed circuit board, and the external connection terminal is on the first surface of the printed circuit board. The safety device and the external connection terminal may be on the first surface of the printed circuit board. The printed circuit board may include a single second region, the second region being at one edge of a long side of the printed circuit board. The printed circuit board may include two second regions, the two second regions being at respective edges of the long side of the printed circuit board, and the first region being between the two second regions.

At least one of the above and other features and advantages may be realized by providing a battery pack, including a bare cell, and a protective circuit board at one side of the bare cell and electrically connected to the bare cell, the protective circuit board including a printed circuit board, the printed circuit board including a first region and a second region, at least one safety device on the first region of the printed circuit board, the first region being thinner than the second region along a direction perpendicular to a contact plane between the printed circuit board and the safety device, and an external connection terminal on the printed circuit board.

The external connection terminal may be on the second region of the printed circuit board. The first region may include a smaller number of layers as compared to the second region. The safety device and the external connection terminal may be on different surfaces of the printed circuit board. The safety device and the external connection terminal may be on a same surface of the printed circuit board. The printed circuit board may include a first surface and a second surface opposite the first surface, the first surface being substantially planar, and the second surface defining the first region thinner than the second region with respect to a distance between the first and second surfaces. The safety device may be on the second surface of the printed circuit board and the external connection terminal is on the first surface of the printed circuit board, the first surface facing the bare cell. The safety device and the external connection terminal may be on the first surface of the printed circuit board, the first surface facing away from the bare cell. The printed circuit board may include a single second region, the second region being at one edge of a long side of the printed circuit board. The printed circuit board may include two second regions, the two second regions being at respective edges of the long side of the printed circuit board, and the first region being between the two second regions.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1A:
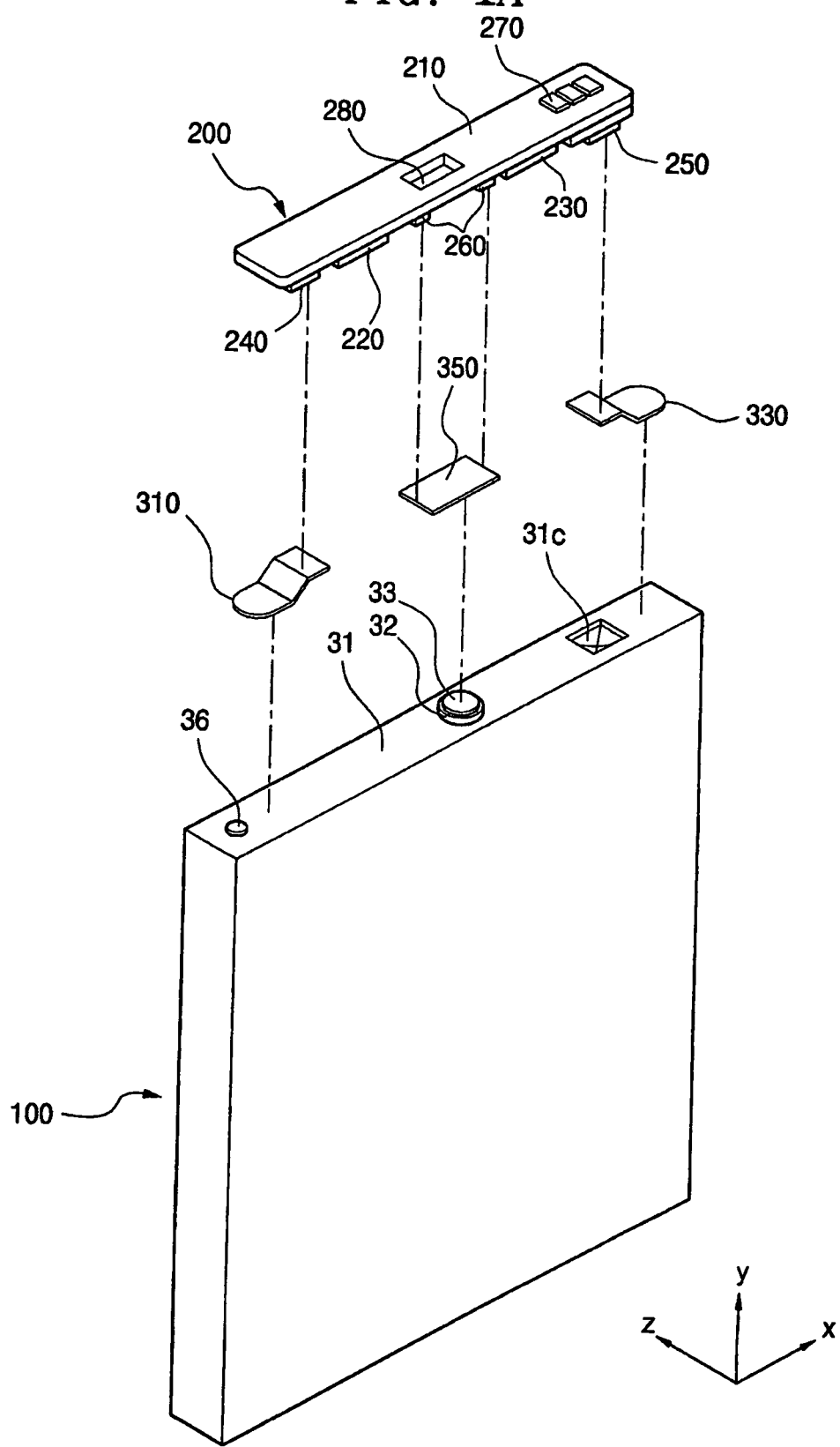
FIGS. 1A-1B illustrate exploded and assembled perspective views, respectively, of a battery pack according to an example embodiment.

Korean Patent Application No. 10-2008-0029039, filed on Mar. 28, 2008, in the Korean Intellectual Property Office, and entitled: "Protective Circuit Board and Battery Pack Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Figure 1B:
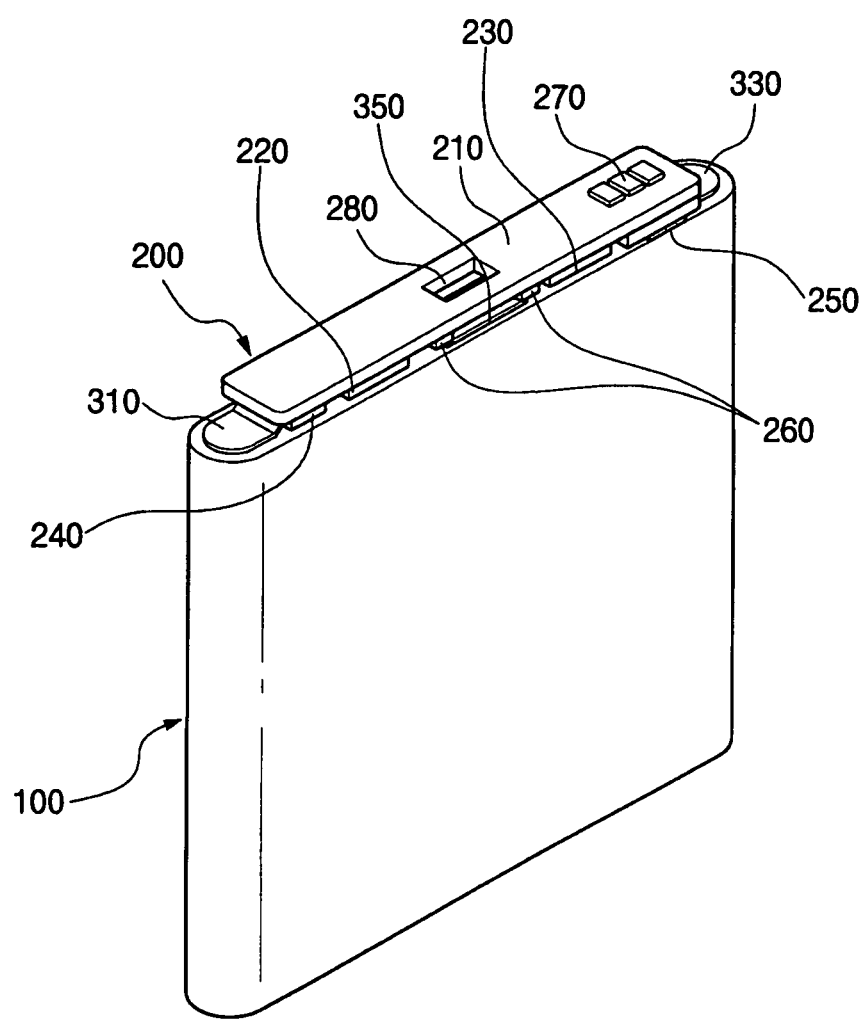
Figure 2:
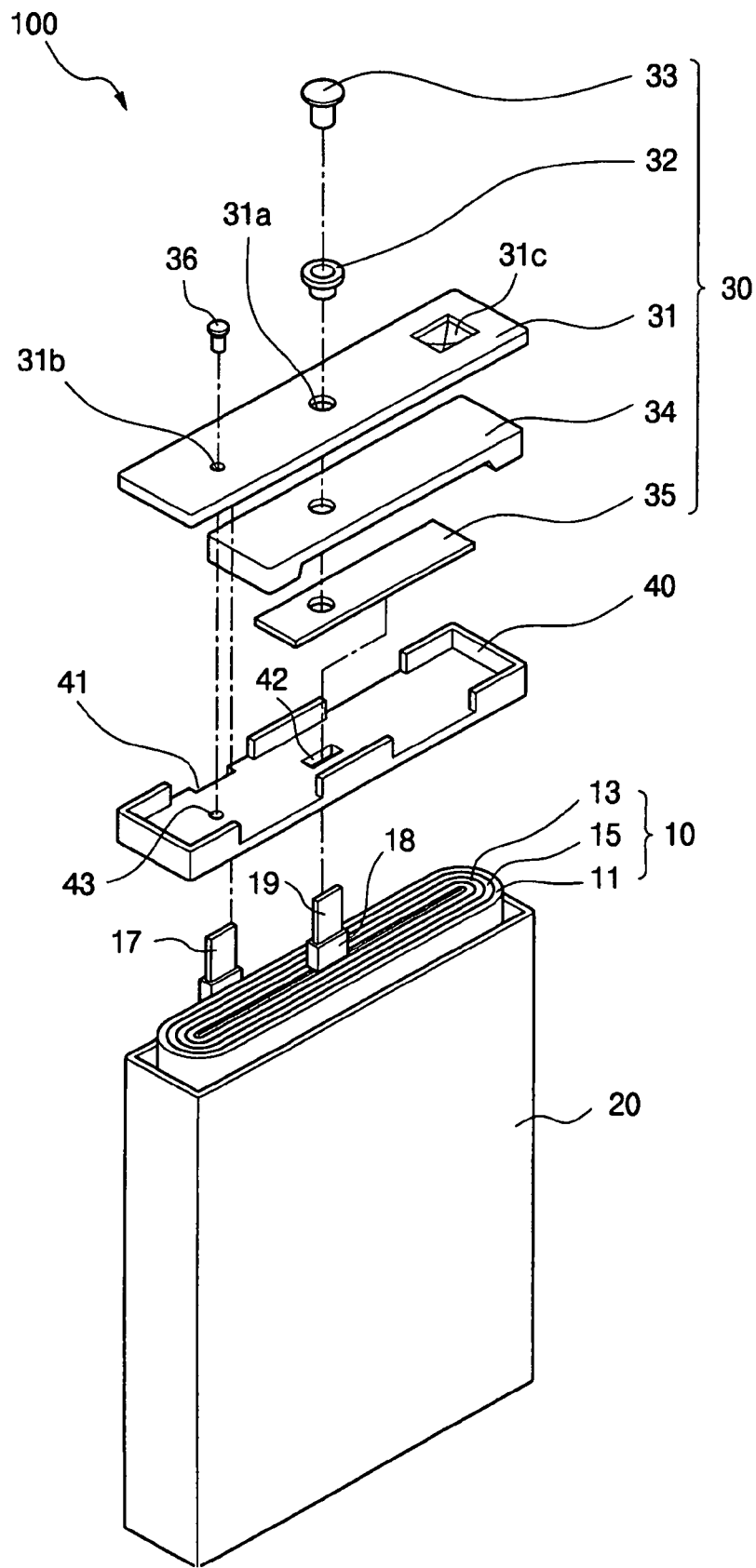
FIG. 2 illustrates an exploded perspective view of a bare cell included in a battery pack according to an example embodiment.

A battery pack according to an example embodiment will be described in more detail below with reference to FIGS. 1A-2. FIGS. 1A-1B illustrate exploded and assembled perspective views of a battery pack according to an example embodiment. FIG. 2 illustrates an exploded perspective view of a bare cell in the battery pack of FIGS. 1A-1B.

With reference to FIGS. 1A-1B, a battery pack may include a bare cell 100 and a protective circuit board 200 positioned at one side of the bare cell 100, e.g., the protective circuit board 200 may overlap a surface of the bare cell 100. The bare cell 100 may be electrically connected to the protective circuit board 200 via at least one lead plate, e.g., first lead plates 310 and 330 and second lead plate 350.

With reference to FIG. 2, the bare cell 100 may include a can 20, an electrode assembly 10 in the can 20, and a cap assembly 30 positioned at an opening of the can 20. The cap assembly 30 may seal the electrode assembly 10 in the can 20. As illustrated in FIGS. 1A-1B, the protective circuit board 200 may be positioned on the cap assembly 30 of the bare cell 100.

As illustrated in FIG. 2, the electrode assembly 10 may include a first electrode plate 11, a second electrode plate 13, and a separator 15 between the first and second electrode plates 11 and 13. The first electrode plate 11, second electrode plate 13, and separator 15 may be stacked and rolled to have a jellyroll shape, as further illustrated in FIG. 2. For convenience, the first electrode plate 11 may be referred to hereinafter as a positive electrode plate, and the second electrode plate 13 may be referred to hereinafter as a negative electrode plate. It is noted, however, that the polarity of the first and second electrode plates 11 and 13 may be changed with respect to a process of forming the polarity.

The positive electrode plate 11 may be formed by applying a positive electrode active material to a positive electrode collector composed of, e.g., aluminum or the like. The positive electrode plate 11 may include a first portion, i.e., a portion including the positive electrode active material, and a second portion, i.e., a portion to which the positive electrode active material may not be applied. The second portion may be referred to as a "positive electrode non-coated portion".

The negative electrode plate 13 may be formed by applying a negative electrode active material to a negative electrode collector composed of, e.g., copper or the like. The negative electrode plate 13 may include a first portion, i.e., a portion including the negative electrode active material, and a second portion, i.e., a portion to which the negative electrode active material may not be applied. The second portion may be referred to as a "negative electrode non-coated portion".

The positive electrode collector may include, e.g., stainless steel, nickel, aluminum, titanium, or a combination thereof, or aluminum or stainless steel surface-processed using one or more of carbon, nickel, titanium, silver, aluminum, and aluminum alloy. The negative electrode collector may include, e.g., stainless steel, nickel, copper, titanium, or a combination thereof, or copper or stainless steel surface-processed using one or more of carbon, nickel, titanium, silver, copper, and copper alloy.

The separator 15 may be interposed between the positive electrode plate 11 and the negative electrode plate 13, and may prevent a short circuit between the first and second electrode plates 11 and 13. The separator 15 may be formed of any suitable separator material, e.g., a thermoplastic resin. Examples of suitable thermoplastic resins may include one or more of polyethylene (PE), polypropylene (PP) or the like.

A surface of the separator 15 may have a porous membrane structure to provide a path through which lithium ions may move. When a temperature inside the battery increases to be around the melting point of the thermoplastic resin, the separator 15 may melt, thereby blocking the porous membrane structure to become an insulating film. As the porous membrane structure of the separator 15 is changed into the insulating film, the movement of the lithium ions between the positive electrode plate 11 and the negative electrode plate 13 may be interrupted, thereby stopping an electric current flow in the battery and ending temperature increase inside the battery.

As illustrated in FIG. 2, the electrode assembly 10 may further include first and second electrode tabs 17 and 19. The first electrode tab 17 may be electrically connected between the first electrode plate 11 and a cap plate 31 of the cap assembly 30. The first electrode tab 17 may be attached to the positive electrode non-coated portion of the first electrode plate 11 to be electrified. The second electrode tab 19 may be electrically connected between the second electrode plate 13 and an electrode terminal 33 of the cap assembly 30. The second electrode tab 19 may be attached to the negative electrode non-coated portion of the second electrode plate 13 to be electrified. Accordingly, the first and second electrode tabs 17 and 19 may have same polarities as the first and second electrode plates 11 and 13, respectively. Hereinafter, the first electrode tab 17 may be referred to as a positive electrode tab, and the second electrode tab 19 may be referred to as a negative electrode tab. The positive and negative electrode tabs 17 and 19 may be formed of, e.g., nickel, and may be attached to the respective positive and negative electrode non-coated portions by, e.g., ultrasonic welding, laser welding or the like.

An insulating tape 18 may be wound around each of the positive electrode tab 17 and the negative electrode tab 19 at boundaries where the positive and negative electrode tabs 17 and 19 may be drawn outwardly from the electrode assembly 10, as illustrated in FIG. 2. The insulating tape 18 may prevent a short circuit between the first and second electrode plates 11 and 13.

As illustrated in FIG. 2, the can 20 of the bare cell 100 may be composed of, e.g., a metal material. For example, the can 20 may be formed of a flexible metal, e.g., one or more of aluminum, an aluminum alloy, stainless steel or the like. The can 20 may have a volumetric structure with an open top. If the can 20 is formed of the metal material, the can 20 may exhibit a predetermined polarity and, therefore, may be used as an electrode terminal.

The can 20 may have any suitable volumetric structure, e.g., a pouch type, a cylindrical container type, and so forth. For example, as illustrated in FIG. 2, the can may have a polygonal structure, e.g., a prism structure. It is noted, however, that the can 20 may have other configurations within the scope of the present invention, e.g., the can 20 may have a polygonal structure with rounded edges or an oval shape. The can 20 may have sufficient dimensions to include the electrode assembly 10, an electrolyte, and an insulating case 40 on the electrode assembly 10. The open top of the can 20 may be sealed with the cap plate 31, e.g., by welding or thermal bonding.

As illustrated in FIG. 2, the cap assembly 30 may include a cap plate 31, an insulating gasket 32, an electrode terminal 33, an insulating plate 34, a terminal plate 35, and an electrolyte injection-hole stopper 36.

The cap plate 31 may be attached to the open top of the can 20 to seal the electrode assembly 10 in the can 20. Accordingly, the cap plate 31 may have a substantially same size and shape as the open top of the can 20. The cap plate 31 may include a terminal through-aperture 31a into which the electrode terminal 33 may be inserted, an electrolyte injection hole 31b formed to provide a path for injecting the electrolyte inside the can 20, and a vent 31c formed to discharge gas by breaking when the pressure inside the battery increases. The vent 31c may include a notch formed to facilitate breaking of the vent 31c. The electrolyte injection-hole stopper 36 may be inserted into the electrolyte injection hole 31b to close it.

The insulating gasket 32 may be combined with the terminal through-aperture 31a formed on the cap plate 31, and may include an insulating material to insulate the electrode terminal 33 from the cap plate 31. The insulating gasket 32 may further include an aperture in a center thereof, so the electrode terminal 33 may fit through the aperture of the insulating gasket 32 into the terminal through-aperture 31a. In other words, the electrode terminal 33 may be combined with the cap plate 31 via the aperture in the insulating gasket 32. For example, the electrode terminal 33 may penetrate through the cap plate 31 to connect to the terminal plate 35.

The insulating plate 34 may be positioned under the cap plate 31, i.e., between the electrode assembly 10 and the cap plate 31, and may insulate an outer surface of the terminal plate 35. The insulating plate 34 may include an aperture therethrough, so the electrode terminal 33 may penetrate through the insulating plate 34 to connect to the terminal plate 35.

The terminal plate 35 may be positioned under the insulating plate 34, i.e., between the electrode assembly 10 and the insulating plate 34. The terminal plate 35 may include a conductive material to facilitate an electrical connection to the electrode terminal 33, thereby forming an electrical path. A lower surface of the terminal plat 35 may be electrically connected to the negative electrode tab 19, so the electrode terminal 33 may function as a negative electrode terminal.

The insulating case 40 may be positioned on the electrode assembly 10, i.e., between the electrode assembly 10 and the cap assembly 30, as illustrated in FIG. 2. The insulating case 40 may prevent or substantially minimize movement of the electrode assembly 10. For example, the insulating case 40 may include an edge wall, so the terminal plate 35 and the insulating plate 34 covering the terminal plate 35 may be supported, i.e., provide a stable structure.

The insulating case 40 may include a tab groove 41 and a tab aperture 42. The tab groove 41 and the tab aperture 41 may keep the positive electrode tab 17 and the negative electrode tab 19 spaced apart from each other by a predetermined distance to prevent a short circuit therebetween, and may guide the positive electrode tab 17 and the negative electrode tab 19 when the tabs protrude outwardly. The insulating case 40 may include an injection aperture 43 formed to provide a path through which the electrolyte may be injected into the electrode assembly 10.

As illustrated in FIGS. 1A-1B, the protective circuit board 200 may include a printed circuit board 210, on which a wiring pattern is formed, a plurality of safety devices, power terminals, and an external connection terminal 270. Examples of safety device may include a protective module 220, a positive temperature coefficient (PTC) thermistor 230, and the like. The protective module 220 may include, e.g., a switching device, a control circuit unit, a resistor, a capacitor and the like. Examples of power terminals may include first through third terminals 240, 250 and 260. The external connection terminal 270 may be connected to an external electronic product and may form an electric path when charging/discharging the battery.

The safety devices and the power terminals may be mounted on a first surface of the printed circuit board 210, i.e., a surface facing the electrode assembly 10. The external connection terminal 270 may be mounted on a second surface of the printed circuit board 210, i.e., a surface opposite the first surface, and may be connected to an external source, e.g., an external electronic/electric product. Hereinafter, the first surface of the printed circuit board 210 may be referred to as a bottom surface of the printed circuit board 210, and the second surface of the printed circuit board 210 may be referred to as a top surface of the printed circuit board 210. Accordingly, the safety devices on the printed circuit board 210 may face the electrode assembly 10, and the external connection terminal 270 may face away from the electrode assembly 10, so the safety device and the external connection terminal 270 may be mounted on different surfaces of the printed circuit board 210.

The protective circuit board 200 may further include an aperture 280 formed through the printed circuit board 210. The aperture 280 may be formed at a position corresponding to the electrode terminal 33, i.e., the electrode terminal 33 may be exposed through the aperture 280. For example, when the bare cell 100 is connected to the protective circuit board 200, e.g., by welding the power terminal 260 and the electrode terminal 33, the aperture 280 may provide a path for the welding. Therefore, the aperture 280 may have a sufficient size for performing the welding.

Figure 3A:
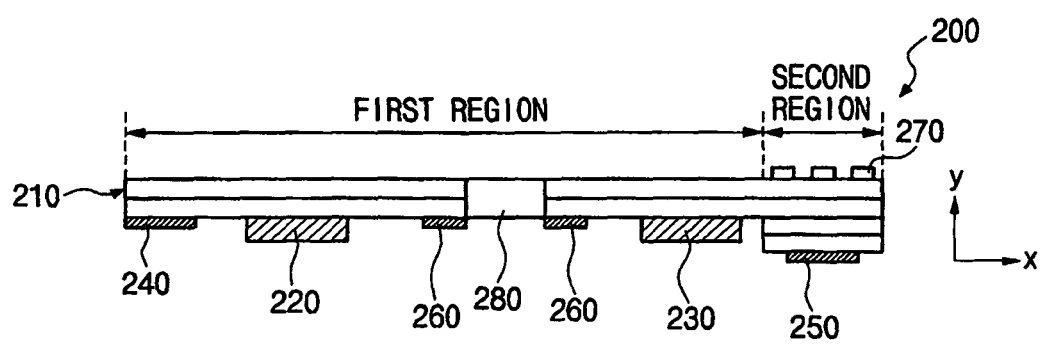
FIG. 3A illustrates a cross-sectional view of a protective circuit board according to an example embodiment.

The printed circuit board 210 may have non-uniform thickness along a vertical direction, i.e., as measured between the first and second surfaces along the y-axis, as illustrated in FIG. 3A. As further illustrated in FIG. 3A, the second surface of the printed circuit board 210 may be substantially planar, and the first surface of the printed circuit board 210, i.e., the surface facing the electrode assembly 10, may not be planar.

More specifically, the printed circuit board 210 may include a first region and a second region adjacent to each other and having different thicknesses. As illustrated in FIG. 3A, the second region may correspond to an area including the external connection terminal 270, and the first region may include a remaining portion of the printed circuit board 210. The second region may be peripheral to the first region, and may have a different thickness along the vertical direction as compared to the first region. For example, as further illustrated in FIG. 3A, the second region may be thicker than the first region.

Each of the first and second regions of the printed circuit board 210 may be formed of a different number of layers. For example, as illustrated in FIG. 3A, a number of layers forming the second region may be larger than a number of layers forming the first region. For example, two layers may be formed along an entire length of the printed circuit board 210, i.e., overlapping both first and second regions, and additional two layers may be formed only in the second region. Accordingly, as illustrated in FIG. 3A, the first region of the printed circuit board 210 may include two layers, and the second region may include four layers. It is noted, however, that other configurations of the stacked layers of the printed circuit board 210, e.g., different number of layers, different thicknesses of layers, and so forth, are within the scope of the present invention.

Accordingly, when the protective circuit board 200 is attached to the bare cell 100, the entire second surface of the printed circuit board 210 may be at a uniform, predetermined distance from the electrode assembly 10, and portions of the first surface of the printed circuit board 210 corresponding to the first and second regions may be at different distances from the electrode assembly 10. In other words, a vertical distance along the y-axis between the first surface of the circuit board 210 in the second region and the electrode assembly 10 may be shorter than a vertical distance between the first surface of the circuit board 210 in the first region and the electrode assembly 10. For example, a distance between the electrode assembly 10 and the second power terminal 250 on the first surface in the second region of the printed circuit board 210 may be shorter than a distance between the electrode assembly 10 and the first power terminal 240 or the protective module 220 on the first surface in the first region of the printed circuit board 210. It is noted that while the distance between the safety device and the electrode assembly 10 may increase, a vertical distance between a first surface in the second region to the electrode assembly 10 may decrease, i.e., an overall distance between the protective circuit board 200 and the bare cell 100 may decrease.

The safety devices, e.g., the protective module 220, the PTC thermistor 230, and the like, and the power terminals 240 and 260 may be on the first surface of the printed circuit board 210 in the first region. A low current line for driving the safety devices, i.e., a non-complicated current pattern, may be mounted in the first region. Since the safety devices are mounted on the first region, which is thinner, the vertical distance between the safety devices and the bare cell 100 may increase, so capacity of the bare cell 100 may increase proportionately with respect to the increased distances between the safety devices and the bare cell 100. In other words, the capacity of the bare cell 100 may increase as a thickness difference between the first and second regions increases.

The external connection terminal 270 may be in the second region. A high current line, i.e., a complicated current pattern, may be mounted onto the second region to connect the external connection terminal 270 to the external electronic/electric product. Since the external connection terminal 270 with the high current line is on the second surface of the printed circuit board 210 in the second region, which is thicker than the first region, a sufficient distance may be provided between the high current line and the electrode assembly 10, thereby preventing or substantially minimizing interference between the high current line of the external connection terminal 270 and a high current in the electrode assembly 10. In contrast, when high current lines of the external connection terminal 270 and the electrode assembly 10 are too close, interference may occur between the high current flows, thereby causing signal distortion and malfunction.

As illustrated in FIG. 3A, the external connection terminal 270 may be positioned at one edge of a long side of the printed circuit board 210. Accordingly, the second region may be formed at one edge of the long side of the printed circuit board 210, corresponding to the position at which the external connection terminal 270 is formed. When the second region is formed only at one edge of the printed circuit board 210, as illustrated in FIG. 3A, edges at the bottom surface of the printed circuit board 210 may have different thicknesses. For example, as further illustrated in FIG. 3A, a cross-sectional view of the printed circuit board 210 may have a "⌐" shape. Accordingly, when the bare cell 100 and the protective circuit board 200 are connected to each other, the first lead plates 310 and 330 may be positioned between the bare cell 100 and the protective circuit board 200 to adjust thickness differences between the edges of the printed circuit board 210.

The first lead plates 310 and 330 may be connected to the respective first power terminal 240 and 250. For example, one end of each of the first lead plates 310 and 330 may be connected to respective first power terminals 240 and 250, and another end of each of the first lead plates 310 and 330 may be connected to the cap plate 31. The first lead plates 310 and 330 may be electrode lead plates to form an electrical path between the cap plate 31 and the protective circuit board 200. For example, one of the first lead plates 310 and 330 may be used as an electrode lead plate, and the other of the first lead plates 310 and 330 may be sued as an auxiliary lead plate to maintain the distance between the bare cell 100 and the protective circuit board 200.

The second lead plate 350 may be connected to the second power terminal 260. One end of the second lead plate 350 may be connected to the second power terminal 260 and the other end thereof may be connected to the electrode terminal 33. The second lead plate 350 may have any suitable shape, e.g., a flat plate shape, and may be exposed outwardly through the aperture 280 to be welded to the electrode terminal 33. The first and second lead plates 310, 330 and 350 may be composed of, e.g., nickel having high conductivity, or the like.

Figure 3B:
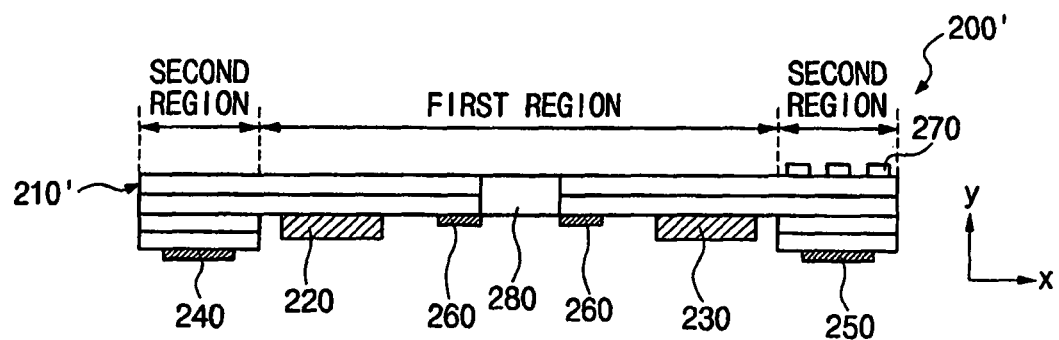
FIG. 3B illustrates a cross-sectional view of a protective circuit board according to another example embodiment.

According to another embodiment illustrated in FIG. 3B, a protective circuit board 200' may be substantially the same as the protective circuit board 200 described previously with reference to FIG. 3A, with the exception of having a printed circuit board 210'. The printed circuit board 210' may have the first region arranged between two portions of the second region, as illustrated in FIG. 3B. In other words, the second region may be formed at both edges of the long side of the printed circuit board 210', so the external connection terminal 270 and the power terminals 240 and 250 may be in the second region and the safety devices and the power terminals 260 may be in the first region. When the second region is formed at both edges of the printed circuit board 210', as illustrated in FIG. 3B, no thickness adjustment by the first lead plates 310 and 330 may be required when connecting the bare cell 100 to the protective circuit board 200'. It is noted that even though the external connection terminal 270 is illustrated in FIG. 3B at one edge of the printed circuit board 210', i.e., at right edge, other configurations of the external connection terminal 270 and the second region are within the scope of the present invention, e.g., the external connection terminal 270 may be at a left edge of the printed circuit board 210'.

Figure 4:
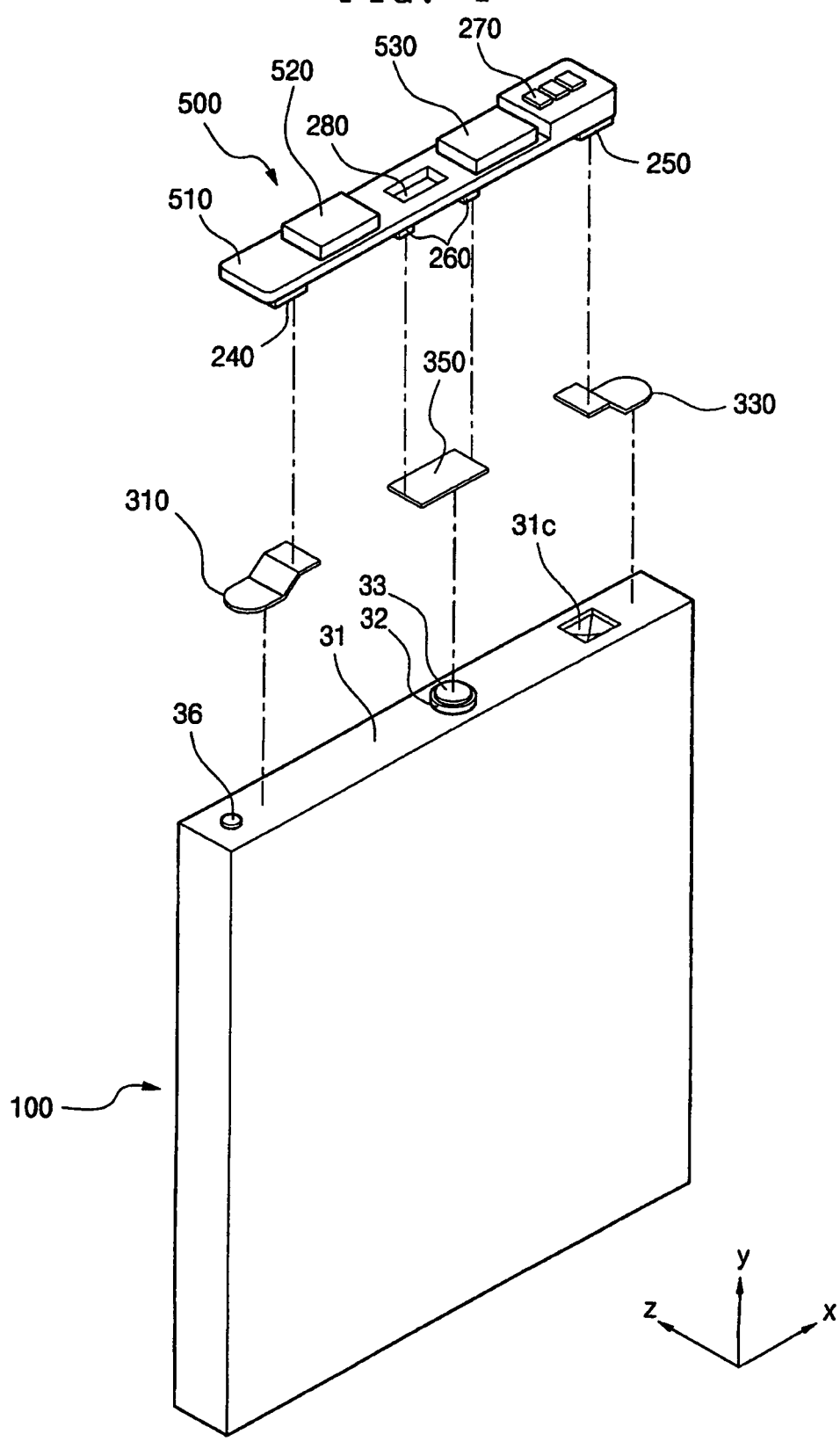
FIG. 4 illustrates an exploded perspective view of a battery pack according to another example embodiment.
Figure 5:
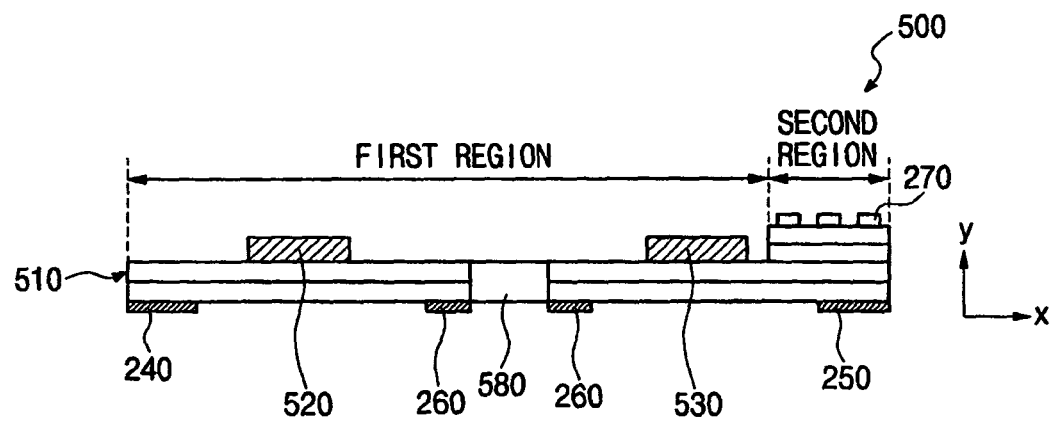
FIG. 5 illustrates a cross-sectional view of a protective circuit board in the battery pack of FIG. 4.

According to another embodiment illustrated in FIGS. 4-5, a battery pack may include the bare cell 100 with a protective circuit board 500 positioned at one side of the bare cell 100. The bare cell 100 may be connected to the protective circuit board 500 via lead plates, e.g., the first lead plates 310 and 330, and the second lead plate 350.

The protective circuit board 500 may include a printed circuit board 510 on which a wiring pattern may be formed, safety devices, e.g., a protective module 520, a PTC thermistor 530, and the like, power terminals, e.g., the first through third terminals 240, 250 and 260, the external connection terminal 270, and the aperture 280. The power terminals may be mounted on a first surface of the printed circuit board 510, i.e., a surface facing the electrode assembly 10, and the safety devices and the external connection terminal 270 may be mounted on a second surface of the printed circuit board 510, i.e., a surface opposing the first surface. In other words, the safety devices and the external connection terminal 270 may be mounted on a same surface of the printed circuit board 510, and may face away from the electrode assembly 10. Hereinafter, the first and second surfaces of the printed circuit board 510 may be referred to as bottom and top surfaces, respectively.

The printed circuit board 510 may have non-uniform thickness along a vertical direction, i.e., as measured between the first and second surfaces along the y-axis, as illustrated in FIG. 5. As further illustrated in FIG. 5, the first surface of the printed circuit board 510 may be substantially planar, and the second surface of the printed circuit board 510, i.e., the surface facing away from the electrode assembly 10, may not be planar.

More specifically, the printed circuit board 510 may include a first region and a second region adjacent to each other and having different thicknesses. As illustrated in FIG. 5, the second region may correspond to an area including the external connection terminal 270, and the first region may include a remaining portion of the printed circuit board 510. The second region may be peripheral to the first region, and may have a different thickness along the vertical direction as compared to the first region. For example, as further illustrated in FIG. 5, the second region may be thicker than the first region.

Each of the first and second regions of the printed circuit board 510 may be formed of a different number of layers. For example, as illustrated in FIG. 5, a number of layers forming the second region may be larger than a number of layers forming the first region. For example, two layers may be formed along an entire length of the printed circuit board 510, i.e., overlapping both first and second regions, and additional two layers may be formed only in the second region. Accordingly, as illustrated in FIG. 5, the first region of the printed circuit board 510 may include two layers, and the second region may include four layers. It is noted, however, that other configurations of the stacked layers of the printed circuit board 510, e.g., different number of layers, different thicknesses of layers, and so forth, are within the scope of the present invention.

Accordingly, when the protective circuit board 500 is attached to the bare cell 100, the entire first surface of the printed circuit board 210 may be at a uniform, predetermined distance from the electrode assembly 10, and portions of the second surface of the printed circuit board 5 10 corresponding to the first and second regions may be at different distances from the electrode assembly 10. In other words, a vertical distance along the y-axis between the second surface of the circuit board 510, i.e., top surface, in the second region and the electrode assembly 10 may be longer that a vertical distance between the second surface of the circuit board 210 in the first region and the electrode assembly 10. For example, a distance between the electrode assembly 10 and the protective module 220 on the second surface in the first region of the printed circuit board 510 may be shorter than a distance between the electrode assembly 10 and external connection terminal 270 on the second surface in the second region of the printed circuit board 510.

The safety devices, e.g., the protective module 520, the PTC thermistor 530 and the like, may be connected to a low current line through which a required current for driving may flow. The low current line may be mounted in the first region because its current pattern is not complicated. Even though the safety devices are on the second surface of the printed circuit board 510, since the safety devices are in the first region, which is thinner, the entire thickness of the protective circuit board 500 may not increase. Further, since the safety devices are on the second surface of the printed circuit board 510, the distance between the safety devices and the bare cell 100 may increase, so capacity of the bare cell 100 may increase proportionately with respect to the increased distances between the safety devices and the bare cell 100.

The external connection terminal 270 may be in the second region. A high current line, i.e., a complicated current pattern, may be mounted onto the second region to connect the external connection terminal 270 to the external electronic/electric product. Since the external connection terminal 270 with the high current line is on the second surface of the printed circuit board 210 in the second region, which is thicker than the first region, a sufficient distance may be provided between the high current line and the electrode assembly 10, thereby preventing or substantially minimizing interference between the high current line of the external connection terminal 270 and a high current in the electrode assembly 10. In contrast, when high current lines of the external connection terminal 270 and the electrode assembly 10 are too close, interference may occur between the high current flows, thereby causing signal distortion and malfunction.

In accordance with example embodiments, the printed circuit board may be formed to have regions with different thicknesses, so the safety devices may be mounted onto the thinner region. Accordingly, while an overall distance between the protective circuit board and the bare cell may be reduced, the capacity may increase in proportion to the reduced distance due to increased distance between the safety device and the bare cell. The battery pack according to example embodiments may have any suitable size, e.g., a small size used in a portable device, and may exhibit high capacity, high operating voltage, and high energy density per unit weight.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A protective circuit board for a battery pack, comprising:
   a printed circuit board, the printed circuit board including a first region and a second region, the first region being thinner than the second region;
   a safety device on the first region of the printed circuit board;
   an external connection terminal on the second region of the printed circuit board; and
   an aperture penetrating the first region of the printed circuit board.

2. The protective circuit board as claimed in claim 1, wherein the first region includes a smaller number of layers as compared to the second region.

3. The protective circuit board as claimed in claim 1, wherein the safety device and the external connection terminal are on a same surface of the printed circuit board.

4. The protective circuit board as claimed in claim 1, wherein the printed circuit board includes a first surface and a second surface opposite the first surface, the first surface being substantially planar, and the second surface defining the first region thinner than the second region with respect to a distance between the first and second surfaces.

5. The protective circuit board as claimed in claim 4, wherein the safety device is on the second surface of the printed circuit board, and the external connection terminal is on the first surface of the printed circuit board.

6. The protective circuit board as claimed in claim 4, wherein the safety device and the external connection terminal are on the first surface of the printed circuit board.

7. The protective circuit board as claimed in claim 4, wherein the printed circuit board includes a single second region, the second region being at one edge of a long side of the printed circuit board.

8. The protective circuit board as claimed in claim 4, wherein the printed circuit board includes two second regions, the two second regions being at respective edges of the long side of the printed circuit board, and the first region being between the two second regions.

9. The protective circuit board as claimed in claim 1, wherein the second region is a peripheral region of the printed circuit board.

10. A battery pack, comprising:
    a bare cell including a cap plate and an electrode terminal;
    a protective circuit board electrically connected to the bare cell, the protective circuit board including:
    a printed circuit board, the printed circuit board including a first region and a second region, the first region being thinner than the second region;
    a safety device on the first region of the printed circuit board;
    an external connection terminal on the second region of the printed circuit board;
    a first lead plate electrically connected between the cap plate of the bare cell and the protective circuit board; and
    a second lead plate electrically connected between the electrode terminal of the bare cell and the protective circuit board,
    wherein the protective circuit board further comprises an aperture penetrating the printed circuit board, the aperture being disposed at the first region of the printed circuit board.

11. The battery pack as claimed in claim 10, wherein the printed circuit board includes a first surface facing the bare cell and a second surface opposite to the first surface, the external connection terminal being disposed only on the second region of the second surface of the printed circuit board.

12. The battery pack as claimed in claim 11, wherein the safety device is disposed on the first region of the first surface of the printed circuit board, the second surface of the printed circuit board being flat.

13. The battery pack as claimed in claim 10, wherein the protective circuit board further comprises a first connection terminal connected to the first lead plate and a second connection terminal connected to the second lead plate, the first and second connection terminals being disposed on the first surface of the printed circuit board.

14. The battery pack as claimed in claim 13, wherein the first connection terminal is disposed on the first surface of the second region of the printed circuit board, and the second connection terminal is disposed on the first surface of the first region of the printed circuit board.

15. The battery pack as claimed in claim 10, wherein the aperture of the protective circuit board overlaps the electrode terminal of the bare cell.

16. The battery pack as claimed in claim 15, wherein the second lead plate is disposed between the aperture of the protective circuit board and the electrode terminal of the bare cell.

17. The battery pack as claimed in claim 10, wherein a width of the second region is substantially continuous and uniform along a first direction perpendicular to a second direction and to a third direction, the second direction extending along a thickness direction of the first and second regions, and the third direction extending along a line connecting the first and second regions.

18. The battery pack as claimed in claim 10, wherein the aperture of the protective circuit board is horizontally spaced apart from the external connection terminal.

19. The battery pack as claimed in claim 10, wherein the external connection terminal is on an outermost surface of the battery pack.

* * * * *